(12) United States Patent
Ghosh et al.

(10) Patent No.: US 6,840,311 B2
(45) Date of Patent: Jan. 11, 2005

(54) COMPACT THERMOSIPHON FOR DISSIPATING HEAT GENERATED BY ELECTRONIC COMPONENTS

(75) Inventors: Debashis Ghosh, Amherst, NY (US); Mohinder Singh Bhatti, Amherst, NY (US); Ilya Reyzin, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 11 days.

(21) Appl. No.: 10/374,346

(22) Filed: Feb. 25, 2003

(65) Prior Publication Data

US 2004/0163798 A1 Aug. 26, 2004

(51) Int. Cl.[7] .................................................. H05K 7/20
(52) U.S. Cl. .................................. 165/104.33; 361/700
(58) Field of Search ....................... 165/104.33, 104.71, 165/104.26, 185, 80.3; 361/710; 257/714, 715

(56) References Cited

U.S. PATENT DOCUMENTS

| | | | | |
|---|---|---|---|---|
| 4,019,098 A | * | 4/1977 | McCready et al. | .... 165/104.33 |
| 4,640,347 A | * | 2/1987 | Grover et al. | .......... 165/104.26 |
| 4,833,567 A | | 5/1989 | Saaski et al. | ............... 361/385 |
| 5,305,184 A | | 4/1994 | Andresen et al. | ........... 361/699 |
| 5,323,292 A | | 6/1994 | Brzezinski | ................... 361/689 |
| 5,508,884 A | | 4/1996 | Brunet et al. | ................ 361/698 |
| 5,520,244 A | | 5/1996 | Mundinger et al. | .... 165/104.33 |
| 5,704,416 A | | 1/1998 | Larson et al. | .......... 165/104.33 |
| 5,720,338 A | * | 2/1998 | Larson et al. | .......... 165/104.33 |
| 5,924,481 A | * | 7/1999 | Tajima | ................... 165/104.33 |
| 6,082,443 A | | 7/2000 | Yamamoto et al. | .... 165/104.26 |
| 6,469,892 B2 | * | 10/2002 | Ueda et al. | ............ 165/104.33 |
| 6,588,498 B1 | | 7/2003 | Reyzin et al. | |
| 6,625,024 B2 | * | 9/2003 | Mermet-Guyennet | .. 165/104.33 |
| 2002/0149912 A1 | | 10/2002 | Chu | ............................ 361/700 |

FOREIGN PATENT DOCUMENTS

| JP | 0083184 | * | 5/1983 | ............. 165/104.33 |
|---|---|---|---|---|

* cited by examiner

Primary Examiner—Allen J. Flanigan
(74) Attorney, Agent, or Firm—Patrick M. Griffin

(57) ABSTRACT

A compact thermosiphon assembly for dissipating heat generated by electronic components using a working fluid includes a tube having a first end and a second end and a flat cross section defining an elongated chamber is disclosed. The tube has an evaporation region for receiving heat to evaporate the working fluid into a vaporized working fluid within the chamber disposed between a first condensation region and a second condensation region opposite the first condensation region for condensing the vaporized working fluid back into a liquefied working fluid within the chamber. Each of the condensation regions have a first portion extending upwardly at a first angle from the evaporation region and a second portion extending upwardly at a second angle different than the first angle.

22 Claims, 5 Drawing Sheets

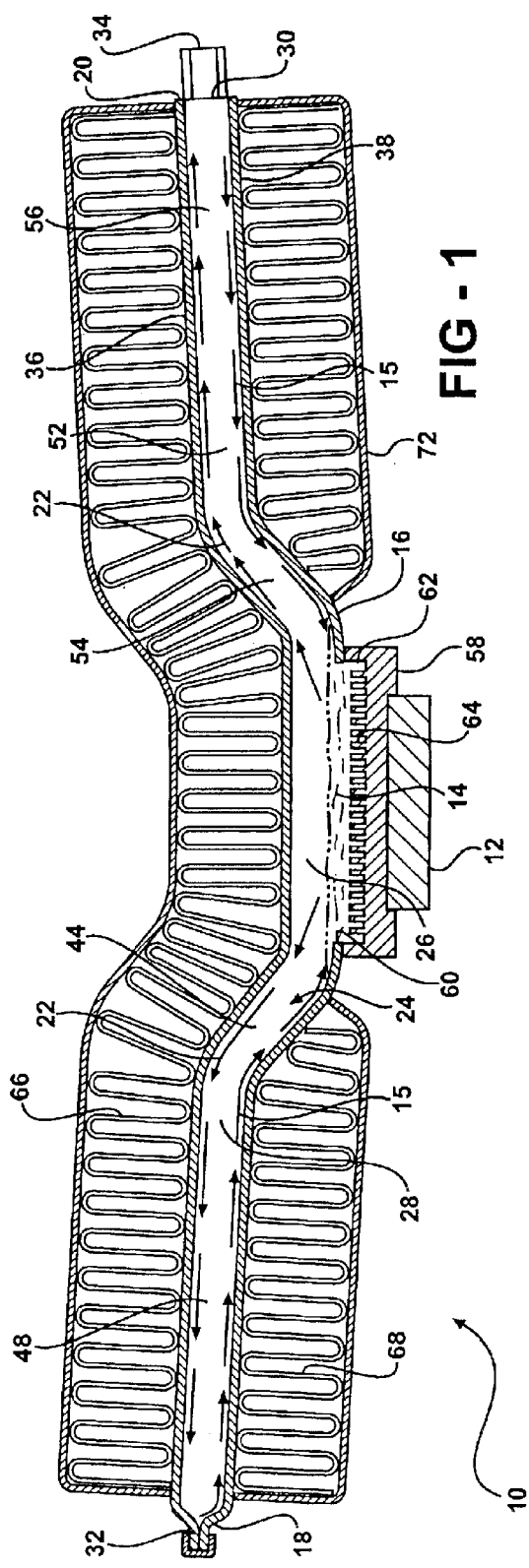
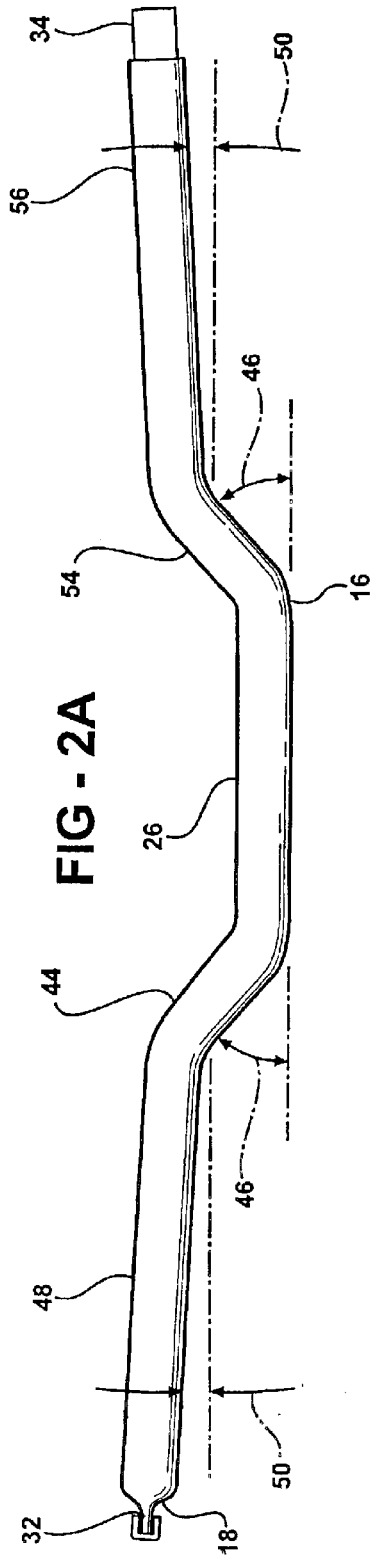

US 6,840,311 B2

COMPACT THERMOSIPHON FOR DISSIPATING HEAT GENERATED BY ELECTRONIC COMPONENTS

BACKGROUND OF THE INVENTION

1. Field of the Invention

The subject invention relates to a compact thermosiphon assembly for dissipating heat generated by electronic components using a working fluid.

2. Description of the Related Art

Various thermosiphon assemblies for dissipating heat generated by electronic components using a working fluid are known to those skilled in the art. These assemblies typically include an evaporation region for receiving heat to evaporate the working fluid into a vaporized working fluid within the chamber and a condensation region for condensing the vaporized working fluid back into the liquefied working fluid within the chamber. External fins extend from the condensation regions into a cooling fluid, which is typically air, and the cooling fluid is forced past the external fins by another source, such as a fan.

The evaporation region is directly below the condensation region which is directly below the external fins. The working fluid is vaporized in the evaporation region by the dissipation of the heat from the electronic component. The vaporized working fluid rises into the condensation region where the heat is dissipated from the vaporized working fluid to the cooling fluid through the external fins. The vaporized working fluid liquefies and falls back into the evaporation region. These assemblies are inexpensive and simple to manufacture due to the stacked arrangement of the components. However, they require additional space in the component for use in order to achieve maximum dissipation of heat because surface area is limited.

These assemblies are typically used in electronic devices with electronic components such as in computers having computer chips. As the trend continues to make these electronic devices smaller and faster, in order to increase the speed of computers, the chip power density rises to 100–200 W/cm$^2$, which must be dissipated. Such related art assemblies; as described above, are shown in United States Published Patent Application No. US 2002/0149912 A1;U.S. Pat. Nos. 5,508,884; and 6,082,443. However, each of these related art assemblies require large package height for placing the thermosiphon in the electronic device because of their large condensation region. These assemblies also require high power fans to move air through the fins to establish sufficient cooling. Therefore, these assemblies are disadvantageous for use with faster, smaller electronic devices.

Other related art thermosiphons are shown in U.S. Pat. Nos. 4,833,567; 5,323,292; and 5,704,416. These patents generally disclose thermosiphons having multiple external fins. These external fins extend from both the evaporation region and the condensation region of the thermosiphons thereby requiring a substantial amount of space within the electronic device. However, none of these thermosiphons have the condensation region offset from the evaporation region to allow for a compact thermosiphon design.

These related art assemblies are characterized by one or more inadequacies. Therefore, it is desirable to provide a compact thermosiphon assembly having a condensation region angled upwardly and offset from the evaporation region that can dissipate increased generated heat while still being small enough to fit in the smaller electronic devices.

BRIEF SUMMARY OF THE INVENTION AND ADVANTAGES

The subject invention provides a compact thermosiphon assembly for dissipating heat generated by electronic components using a working fluid. The assembly includes a tube having a first end and a second end and a flat cross section defining an elongated chamber extending between the ends. The tube has an evaporation region for receiving heat to evaporate the working fluid into a vaporized working fluid within the chamber and a first condensation region for condensing the vaporized working fluid back into the liquefied working fluid within the chamber. The assembly includes a first portion of the first condensation region extending upwardly at a first angle from the evaporation region for conveying the condensed liquid back down into the evaporation region.

The subject invention also provides a method of forming a compact thermosiphon assembly. The method includes the steps of extruding a tube having a first end and a second end defining a chamber and having a first condensation region and an evaporation region. The method includes bending a first portion of the first condensation region upwardly at a first angle from the evaporation region for conveying condensed working fluid back to the evaporation region.

Accordingly, the subject invention overcomes the inadequacies that characterize the related art assemblies. Specifically, the subject invention provides a compact thermosiphon having a condensation region offset from an evaporation region. The location of the condensation region allows the thermosiphon to be compact and operate in smaller electronic devices while still providing adequate heat dissipation from the electronic components.

BRIEF DESCRIPTION OF THE SEVERAL VIEW OF THE DRAWINGS

Other advantages of the present invention will be readily appreciated as the same becomes better understood by reference to the following detailed description when considered in connection with the accompanying drawings wherein:

FIG. 1 is a cross-sectional view of a compact thermosiphon assembly according to the subject invention;

FIG. 2A is a side view of the tube showing a first portion of the first condensation region extending upwardly at a first angle and a second portion of the first condensation region extending upwardly at a second angle;

DETAILED DESCRIPTION OF THE INVENTION

Referring to the Figures, wherein like numerals indicate like or corresponding parts throughout the several views, a compact thermosiphon assembly for dissipating heat generated by electronic components 12 using a working fluid 14 is shown generally at 10 in FIG. 1. The subject invention is particularly useful with electronic components 12 such as computer chips, telecommunication chips, microprocessors assemblies, and the like. These electronic components 12 are used in various electronic devices (not shown), such as computer systems, telecommunication systems, and the like. The subject invention is particularly useful with commonly termed "1U" or 1.75 inch package height computer server applications. The electronic components 12 are preferably flexibly attached to the thermosiphon assembly 10. However, one skilled in the art may connect the electronic components 12 by other methods without deviating from the subject invention.

Typical working fluids 14 that may be employed with the subject invention include, but are not limited to, demineralized water, methanol, halocarbon fluids, and the like. One example of a possible halocarbon fluid is R134a. It is to be understood that one skilled in the art may select various working fluids 14 depending upon the amount of heat generated by the specific electronic component and the operating temperature of the electronic device.

Figure 2:
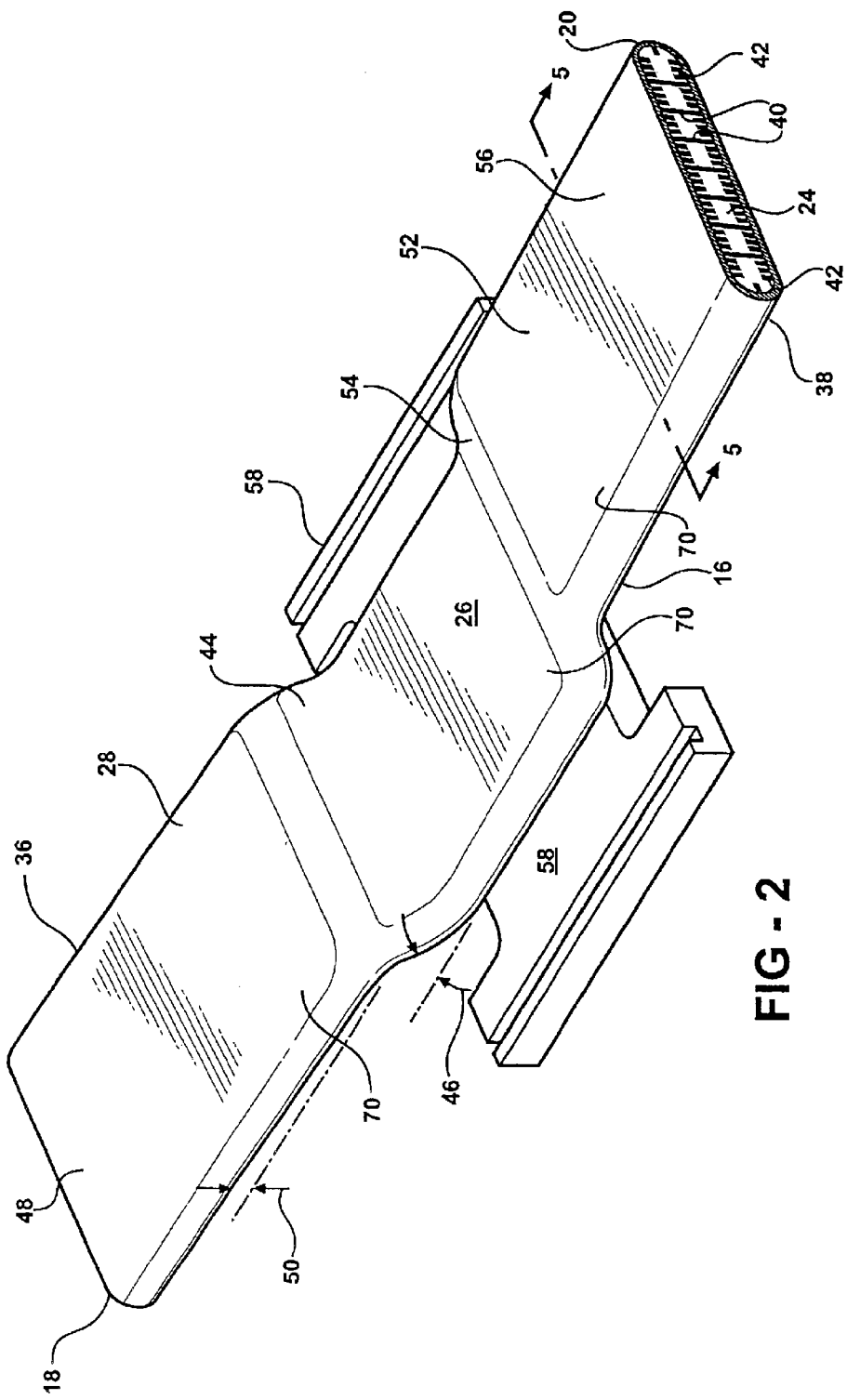
FIG. 2 is a perspective view of an upper surface of a tube forming a part of the assembly having a first condensation region, a second condensation region, and an evaporation region with a evaporator plate attached thereto.
Figure 3:
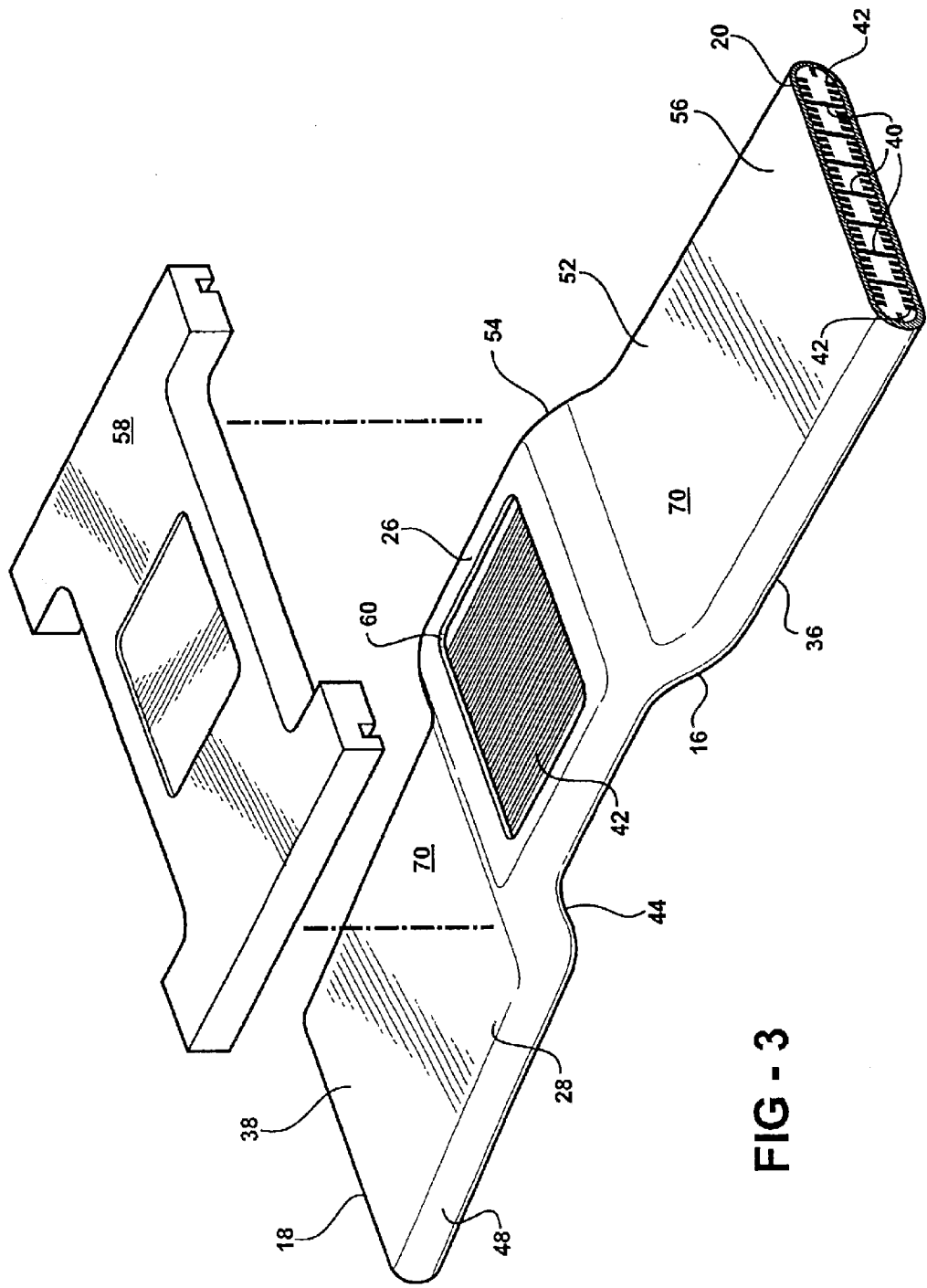
FIG. 3 is a perspective view of a lower surface of the tube having the evaporator plate removed from the evaporation region.
Figure 4:
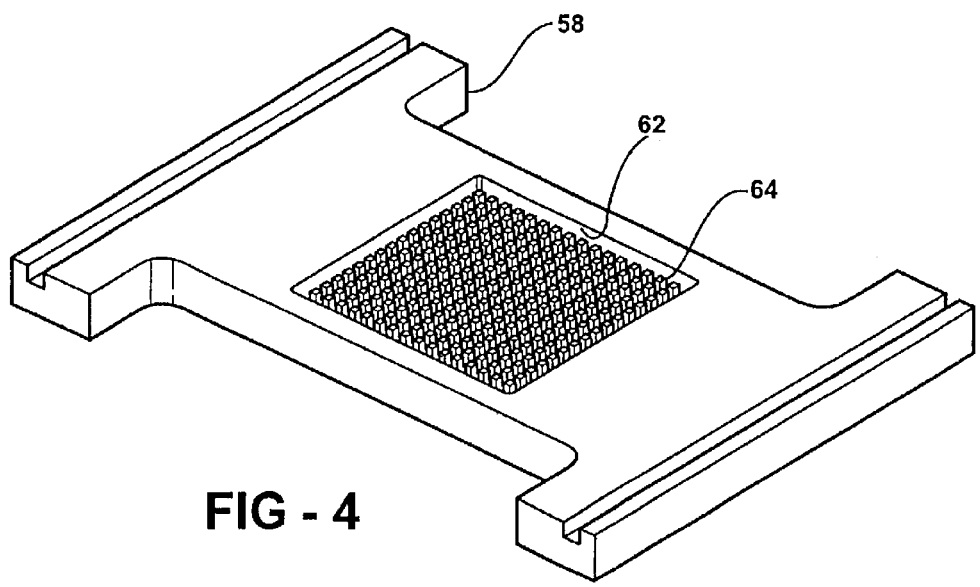
FIG. 4 is a perspective view of the evaporator plate.

The assembly 10 includes a tube 16 having a first end 18 and a second end 20 and a flat cross section defining an elongated chamber 24 extending between the ends 18, 20, as best shown in FIGS. 1, 2, and 3. The tube 16 may be constructed of any type of metal, but it is preferably copper or aluminum. The different types of metal selected depend primarily upon the amount of heat that is generated by the electronic component 12 to be dissipated and the type of working fluid 14 that is used. For example, an aluminum material may not be optimal when water is the working fluid 14 because the life of the assembly 10 may be affected. However, if a different working fluid 14, such as R134A is selected, aluminum material allows for inexpensive construction and reduced weight. When the amount of heat generated is high, the preferred material to use is copper. It is preferable that the tube 16 is seamless in cross-section, which prevents the tube 16 from leaking with extended use. The tube 16 according to the subject invention is seamless because it is formed in an extrusion process, as described below.

Referring back to FIG. 1, the tube 16 has an evaporation region 26 for receiving heat to evaporate the working fluid 14 into a vaporized working fluid 22 within the chamber 24. A first condensation region 28 is in fluid communication with the evaporation region 26 for condensing the vaporized working fluid 22 back into a liquefied working fluid 15 within the chamber 24. A second condensation region 52 is opposite the first condensation region 28 such that the evaporation region 26 is disposed between the first condensation region 28 and the second condensation region 52. The second condensation region 52 is in fluid communication with the evaporation region 26. The working fluid 14 remains in the chamber 24, but flows from the evaporation region 26 to the condensation regions 28, 52 and back again as a result of changing states.

The first end 18 and the second end 20 are sealed to prevent the working fluid 14 from escaping from the chamber 24. The first end 18 and the second end 20 may be sealed with a cap 30 or may be crimped 32 and then sealed. The first end 18 is illustrated as being crimped 32 and the second end 20 is sealed with the cap 30. The cap 30 may also include an inlet 34 for charging the working fluid 14. The inlet 34 allows for an initial charging of the chamber 24 with the working fluid 14 after the ends are sealed. Also, the inlet 34 can be used to recharge the working fluid 14 over time or venting the working fluid 14 at the time of disposal of the electronic device.

The tube 16 further includes an upper surface 36 and a lower surface 38. A plurality of external upper fins 66 engage the upper surface 36 of the tube 16 for dissipating heat from the chamber 24 and a plurality of external lower fins 68 engage the lower surface 38 of the tube 16 for dissipating heat from the chamber 24. Either or both of the upper and lower external fins 66, 68 may be utilized depending upon the amount of heat to be dissipated. The plurality of external upper fins 66 may also engage each of the first condensation region 28, the second condensation region 52, and the evaporation region 26. The external lower fins 68 may engage the first condensation region 28 and the second condensation region 52. By having both the external upper fins 66 and the external lower fins 68, the assembly 10 is able to dissipate a larger amount of heat with shorter and thinner external upper fins 66 and lower fins 68.

Referring to FIGS. 2 and 2A, the tube 16 is illustrated having the external fins 66, 68 removed for clarity. The assembly 10 includes a first portion 44 of the first condensation region 28 extending upwardly at a first angle 46 from the evaporation region 26 for conveying the condensed liquid back down into the evaporation region 26. In one embodiment, the first portion 44 of the first condensation region 28 is coextensive with the first condensation region 28 such that the entire first condensation region 28 extends upwardly at the first angle 46 from the evaporation region 26. In order to accommodate the assembly 10 in a package having a small height, it is preferable to have a second portion 48 of the first condensation region 28 extending upwardly at a second angle 50 different than the first angle 46, as shown in FIG. 2 and will be described more fully below. The first angle 46 is selected from the range of 5 degrees to 75 degrees, preferably from 10 to 75 degrees, and more preferably from 20 to 50 degrees. The second angle 50 is selected from the range of 3 degrees to 45 degrees, preferably from 4 to 35, and more preferably from 5 to 15 degrees. The angled condensation region allows the condensed working fluid 14 to return to the evaporation region 26 under the force of gravity and does not require any additional parts, which results in low maintenance of the assembly 10.

A first portion 54 of the second condensation region 52 extends upwardly at the first angle 46 from the evaporation region 26 for conveying the condensed liquid back down into the evaporation region 26. In one embodiment, the first portion 54 of the second condensation region 52 may be coextensive with the second condensation region 52 such that the entire second condensation region 52 extends upwardly at the first angle 46 from the evaporation region 26. However, in the preferred embodiment, a second portion 56 of the second condensation region 52 extends upwardly at the second angle 50 different than the first angle 46.

The tube 16 also includes supporting webs 40 extending from the upper surface 36 to the lower surface 38 for increasing the strength of the tube 16 and for enhancing heat transfer. The supporting webs 40 form channels that the vaporized working fluid 22 is able to pass through. The number of supporting webs 40 depends upon the amount of support required and the width of the tube 16. If the tube 16 is to be under a lot of pressure or stress, then the tube 16 is to be formed with additional supporting webs 40. However, if the tube 16 will be under little pressure or stress, and does not have a lot of heat to dissipate, the tube 16 may be formed without the supporting webs 40.

An evaporator plate 58 is supported by the tube 16, and more preferably is bonded to the tube 16 as known to those skilled in the art. The electronic component 12 contacts the evaporator plate 58 and transfers heat from the electronic component 12 through the evaporator plate 58 to the working fluid 14. The evaporator plate 58 may be mounted directly to the lower surface 38 of the tube 16. In the preferred embodiment, shown in FIG. 7, the lower surface 38 defines an aperture 60 for securing the evaporator plate 58 thereto. A section is removed from the lower surface 38 to define the aperture 60, such that the evaporator plate 58 is exposed to the working fluid 14. In removing the section from of the lower surface 38, some of the supporting webs 40 may be removed from the aperture 60 and lower surface 38 to create a hollow entry into the chamber 24. The evaporator plate 58 may define a well 62 with a plurality of evaporation fins 64 extending upwardly from the well 62. The plurality of evaporation fins 64 extend into the chamber 24 and contact the working fluid 14 for improving heat dissipation from the electronic components 12. The well 62 and plurality of evaporation fins 64 encourage the working fluid 14 to evaporate more quickly because the working fluid 14 is closer to the heat source, i.e., the electronic component 12 and because the heat transfer surface area is increased because of the evaporation fins 64. The evaporation fins 64 may be any shape known to those skilled in the art of evaporators, but are preferably pyramidal shaped.

Figure 5:
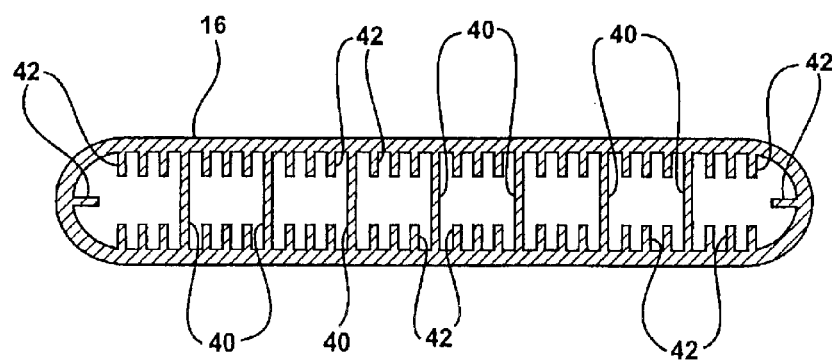
FIG. 5 is a cross-sectional view of the tube along line 5—5 shown in FIG. 2.

Referring to FIG. 5, the tube 16 includes internal fins 42 extending from either one of the upper surface 36 and the lower surface 38 into the chamber 24 for providing additional surfaces to condense the vaporized working fluid 22. In the preferred embodiment, the internal fins 42 extend from both of the upper surface 36 and the lower surface 38. Alternately, the internal fins 42 may extend from only one of the sides with the internal fins 42 having various lengths to achieve a similar result as having internal fins 42 on both surfaces. The internal fins 42 on the upper and lower surfaces 36, 38 may be of the same height or of different heights. Also, these fins 42 may have the same fin density or different fin density on each of the surfaces 36, 38. The spacing of the internal fins 42 and the supporting webs 40 depends upon the operating pressure of the assembly 10 and the rate of liquefied working fluid drainage from the condensation regions 28, 52 to the evaporation region 26. When more internal fins 42 are present, more heat can be dissipated given sufficient space for the vaporized cooling fluid to pass therethrough. It is to be appreciated that the internal fins 42 may be omitted for lower heat dissipation requirements. The upper internal fins 42 extending from the upper surface 36 remain in the evaporation region 26 and help to condense the vaporized working fluid 22, when the section and supporting webs 40 are removed to form the aperture 60.

Figure 6:
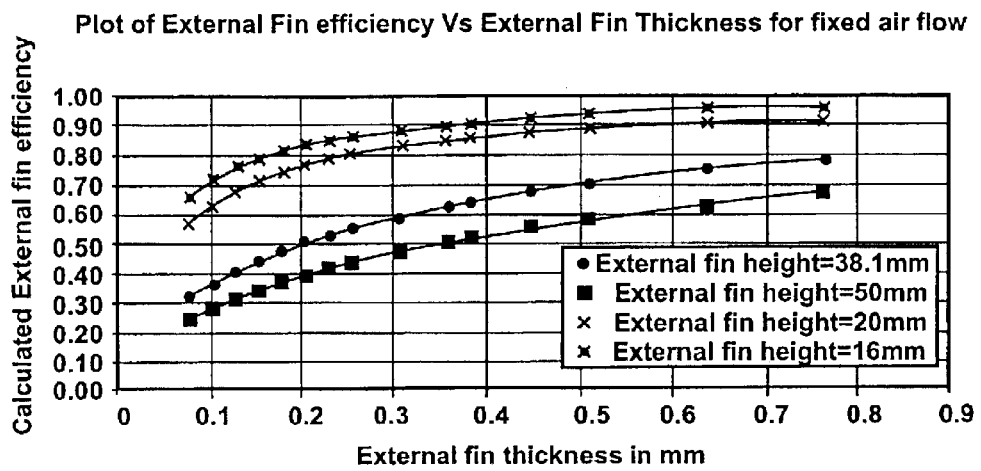
FIG. 6 is a graphical representation of external fin efficiency versus thickness of the external fin.
Figure 7:
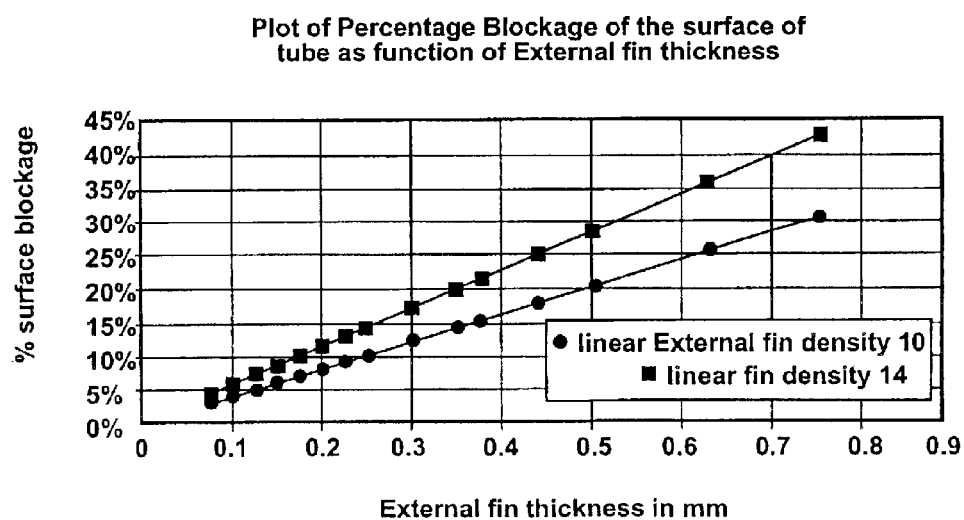
FIG. 7 is a graphical representation of a percentage that the tube surface is blocked versus the external fin thickness.

Referring back to FIGS. 2 and 3, the upper and lower surfaces 36, 38 have a surface area 70, shown without the external fins 66, 68, for placing the external fins 66, 68 thereon. The surface area 70 is defined by the length and width of the tube 16, which also depends upon the type of device the assembly 10 is used with. It is advantageous to have maximum external fin efficiency with the least amount of surface area 70 blockage. As surface area 70 blockage increases, the airside pressure drop increases because of increased fin thickness and fin density. This requires larger fans, which uses additional power and is therefore disadvantageous for a compact thermosiphons. Referring to FIGS. 6 and 7, prior art thermosiphons having external fin heights of 38.1 mm and 50 mm were compared to the subject invention. In FIG. 6, the heat transfer coefficient is assumed to be 60 watts/m$^2$K°. In FIG. 7, the surface area 70 of the tube 16 is assumed to be 70 mm by 70 mm. Typical prior art external fins are 38 mm tall and 0.5 mm thick and result in a 68% external fin efficiency, as read from FIG. 6 and assuming an airside heat transfer coefficient of 60 watts/m$^2$K°. To achieve an efficiency of 67%, with the 50 mm tall external fin, then the external fins need to be 0.762 mm thick. This results in a corresponding surface area 70 blockage of 28% and 42% respectively at a linear fin density of 14 fins per inch (fpi). At a linear fin density of 10 fpi, the surface area 70 blockage becomes 20% and 30% for external fin thickness of 0.5 mm and 0.762 mm respectively.

Because the subject invention allows for external fins on both the upper and lower surfaces 36, 38 of the tube 16, the external fins can be shorter than the prior art and are preferably 16 mm tall. However, the external fins may be any height selected from the range of 5 mm to 30 mm. The external fins 66, 68 on the upper and lower surfaces 36, 38 may be of the same height and thickness or different height and thickness depending upon the available package height and fan power. If the external fins are 16 mm tall and 0.1525 mm thick, assuming the same heat transfer coefficient, the result is a 78% efficiency with only a surface area 70 blockage of 8% at 14 fpi and 6% at 10 fpi. If the fins are the 0.2 mm thick, the fin efficiency is 83% and has a surface area 70 blockage of 11% at 14 fpi and 8% at 10 fpi. The subject invention increases the external fin efficiency while decreasing the surface area 70 blockage. These benefits are realized due to the novel geometric construction of the subject invention. Specifically, the external fin efficiency increases by 11% and reduces blockage of surface area 70 from 42% to 8% at 14 fpi and 28% to 6% at 10 fpi. This allows for a lower powered or smaller fan to be used with the subject invention while achieving the desired efficiency.

The subject invention may also include a housing 72 surrounding the external upper fins 66 and the external lower fins 68 for increasing the strength of the assembly 10 and for directing the flow of air across the external fins 66, 68. The housing 72 may be metal, plastic, or any other type of material capable of supporting the external upper and lower fins 66, 68. Alternately, the housing 72 may be omitted, if desired, depending upon the specific application of the assembly 10. Also, the subject invention is preferably used in conjunction with an air-moving device (not shown), such as an axial fan, or air ducted from a remote fan. The air-moving device moves the cooling fluid across the external fins.

The subject invention also provides a method of forming the compact thermosiphon assembly 10 for dissipating heat generated by electronic components 12 using the working fluid 14. The method includes the steps of extruding the tube 16 having the first end 18 and the second end 20 defining the chamber 24 and having the first condensation region 28 and the evaporation region 26. The next step includes simultaneously extruding supporting webs 40 extending from the upper surface 36 to the lower surface 38 of the tube 16 for increasing the strength of the chamber 24 and simultaneously extruding internal fins 42 extending from either one of the upper surface 36 and the lower surface 38 of the tube 16 to provide additional surfaces to condense the vaporized working fluid 22 while extruding the tube 16. The extrusion process may be carried out using standard extrusion equipment known to those skilled in the art.

The method includes bending the first portion 44 of the first condensation region 28 upwardly at the first angle 46 from the evaporation region 26, as described above, for conveying condensed working fluid 14 back to the evaporation region 26. After the first portion is bent, the second portion 48 of the first condensation region 28 is bent upwardly from the evaporation region 26 at the second angle 50 different than the first angle 46. While forming the assembly 10, after the first portion is bent upwardly, the second portion is typically bent downward from the first angle 46 to the second angle 50, but the second portion still remains angled upwardly from the evaporation region 26. For example, the first portion 44 of the first condensation region 28 is bent upwardly at the angle of 45 degrees. At this point, the first portion extends from the evaporation region 26 to the first end 18. The second portion, which is defined as extending from the first portion to the first end 18, is bent from the 45 degree angle to a 5 degree angle. Therefore, if one starts at the evaporation region 26 and moves toward the first end 18, as shown in FIG. 2, the first portion 44 of the first condensation region 28 angles upward at 45 degrees relative to the evaporation region 26 for a short distance and then the second portion 48 of the first condensation region 28 angles upward at 5 degrees relative to the evaporation region 26 to the first end 18.

Then, the second condensation region 52 is formed opposite the first condensation region 28 by bending the first portion 54 of the second condensation region 52 upwardly from the evaporation region 26 at the first angle 46 and bending the second portion 56 of the second condensation region 52 upwardly from the evaporation region 26 at the second angle 50 different than the first angle 46. The second condensation region 52 extends from the evaporation region 26 to the second end 20. It is preferable that the first condensation region 28 and the second condensation region 52 are shaped identically, however, they may be bent at different angles than the first condensation region 28.

Once the shape of the tube 16 has been formed, the first end 18 and the second end 20 are then sealed. Preferably, the first end 18 is crimped 32 and the second end 20 is sealed with the cap 30 to prevent working fluid 14 from escaping from the chamber 24.

The method further includes the step of positioning the evaporator plate 58 near the lower surface 38 of the tube 16 to transfer heat from the electronic components 12 to the working fluid 14. After the evaporator plate 58 is positioned, it is preferably brazed to the lower surface 38 of the tube 16. Alternately, a section of the lower surface 38 may be removed defining the aperture 60 and the evaporator plate 58 may be secured thereto such that the evaporator plate 58 is exposed to the working fluid 14. Finally, the external upper fins 66 are mounted to the upper surface 36 of the tube 16 and the external lower fins 68 are mounted to the lower surface 38 of the tube 16 for dissipating heat from the chamber 24.

Obviously, many modifications and variations of the present invention are possible in light of the above teachings. The invention may be practiced otherwise than as specifically described within the scope of the appended claims.

What is claimed is:

1. A compact thermosiphon assembly having a minimum package height and for dissipating heat generated by electronic components using a working fluid, said assembly comprising:

a tube having a first end and a second end and a flat cross section defining an elongated chamber and defining a surface area extending between said ends;

said chamber having an evaporation region for receiving heat to evaporate the working fluid into a vaporized working fluid within said chamber and a first condensation region for condensing the vaporized working fluid back into the liquefied working fluid within said chamber;

a first portion of said first condensation region extending upwardly at a first angle from said evaporation region for conveying the condensed liquid back down into said evaporation region; and a second portion of said first condensation region extending upwardly at a second angle less than said first angle for maintaining said surface area throughout said condensation region and for minimizing the height of said assembly.

2. An assembly as set forth in claim 1 wherein said first angle is selected from the range of 5 degrees to 75 degrees.

3. An assembly as set forth in claim 1 where said second angle is selected from the range of 3 degrees to 45 degrees.

4. An assembly as set forth in claim 1 wherein said chamber is further defined as having a second condensation region opposite said first condensation region such that said evaporation region is disposed between said first condensation region and said second condensation region.

5. An assembly as set forth in claim 4 further including a first portion of said second condensation region extending upwardly at said first angle from said evaporation region for conveying the condensed liquid back down into said evaporation region.

6. An assembly as set forth in claim 5 further including a second portion of said second condensation region extending upwardly at said second angle different than said first angle.

7. An assembly as set forth in claim 6 wherein said tube is further defined as being seamless in cross-section.

8. An assembly as set forth in claim 7 wherein said tube is further defined as being formed in an extrusion process.

9. An assembly as set forth in claim 6 wherein said first end is further defined as being crimped to seal said chamber and prevent the working fluid from escaping from said chamber.

10. An assembly as set forth in claim 9 further including a cap having an inlet for charging and venting the working fluid mounted to said second end and sealing said chamber.

11. An assembly as set forth in claim 6 wherein said tube further includes an upper surface and a lower surface and has supporting webs extending from said upper surface to said lower surface for increasing the strength of said tube.

12. An assembly as set forth in claim 11 further including internal fins extending from said upper surface and said lower surface for providing additional surfaces to condense the vaporized working fluid.

13. An assembly as set forth in claim 11 further including internal fins extending from either one of said upper surface and said lower surface for providing additional surfaces to condense the vaporized working fluid.

14. An assembly as set forth in claim 13 further including an evaporator plate supported by said tube for contacting the electronic component and for transferring heat from the electronic component to the working fluid.

15. An assembly as set forth in claim 14 wherein said lower surface of said tube defines an aperture for securing said evaporator plate thereto such that said evaporator plate is exposed to the working fluid.

16. An assembly as set forth in claim 14 wherein said evaporator plate further includes a plurality of evaporation fins extending into said chamber and in contact with the working fluid for improving heat dissipation from the electronic components.

17. An assembly as set forth in claim 14 further including a plurality of external upper fins engaging said upper surface of said tube for dissipating heat from said chamber.

18. An assembly as set forth in claim 17 wherein said plurality of external upper fins are further defined as engaging each of said first condensation region, said second condensation region, and said evaporation region.

19. An assembly as set forth in claim 18 further including a plurality of external lower fins engaging said lower surface of said tube for dissipating heat from said chamber.

20. An assembly as set forth in claim 19 wherein said plurality of external lower fins are further defined as engaging said first condensation region and said second condensation region.

21. An assembly as set forth in claim 20 further including a housing surrounding said external upper fins and said external lower fins for increasing the strength of said assembly.

22. An assembly as set forth in claim 1 having a package height of about 1.75 inches or less.

* * * * *